United States Patent [19]

Bendall

[11] Patent Number: 4,486,709
[45] Date of Patent: Dec. 4, 1984

[54] DEPTH AND REFOCUSING PULSES FOR USE WITH INHOMOGENEOUS RADIOFREQUENCY COILS IN NUCLEAR MAGNETIC RESONANCE SPECTROSCOPY

[76] Inventor: Max R. Bendall, 274 Ford Rd., Burbank, Queensland, 4123, Australia

[21] Appl. No.: 443,607

[22] Filed: Nov. 22, 1982

[51] Int. Cl.³ ............................................ G01R 33/08
[52] U.S. Cl. .................................... 324/314; 324/307; 324/309
[58] Field of Search .............. 324/300, 303, 304, 307, 324/309, 313, 314

[56] References Cited

U.S. PATENT DOCUMENTS

| | | | |
|---|---|---|---|
| 4,301,410 | 11/1981 | Wind | 324/307 |
| 4,385,277 | 5/1983 | Hanley | 324/309 |
| 4,389,613 | 6/1983 | Brown | 324/303 |
| 4,406,986 | 9/1983 | Greenwood | 324/304 |
| 4,412,179 | 10/1983 | Brown | 324/303 |
| 4,442,404 | 4/1984 | Bergmann | 324/309 |
| 4,443,760 | 4/1984 | Edelstein et al. | 324/313 |

*Primary Examiner*—Michael J. Tokar
*Attorney, Agent, or Firm*—Frank H. Foster

[57] ABSTRACT

In a pulsed nuclear magnetic resonance method of analysis, in which a single radiofrequency pulse is applied using an irradiation coil which provides an inhomogeneous radiofrequency field across the sample volume, the inhomogeneity of this field ensures that some sample regions experience a radiofrequency pulse which is closer to a $\pi/2$ pulse angle than for other regions, resulting in a larger signal intensity from the former regions as compared to the latter. If a second pulse is applied after the first, prior to acquisition of the signal, and if the phase of this pulse is alternated through the four phases: 0°, 90°, 180° and 270°, during a series of transients, then, provided the receiver phase is changed by 180° when the second pulse phase is changed by 90°, the signal intensity will accumulate from regions where the second pulse angle is $\pi$ radians and there will be discrimination against regions where the second pulse angle differs markedly from $\pi$ radians. This discrimination towards certain sample regions can be improved by adding further pulses after the second pulse provided the phase of each additional pulse is alternated through all four 90° phase shifts, during a series of transients, independently of the phase alternation of the other pulses, and provided that for each individual 90° phase shift, the receiver phase is changed by 180°. In its simplest form, such a series of pulses may be represented by $\theta;(2\theta[\pm x, \pm y])_n$ indicating n phase alternated pulses additional to the first excitation pulse, where these additional pulses are twice as long as the first pulse.

15 Claims, 10 Drawing Figures

(a)

(b)

(a)           (b)

DEPTH AND REFOCUSING PULSES FOR USE WITH INHOMOGENEOUS RADIOFREQUENCY COILS IN NUCLEAR MAGNETIC RESONANCE SPECTROSCOPY

This invention relates to the application of specific radiofrequency pulse schemes to inhomogeneous irradiation coils in a nuclear magnetic resonance (NMR) method of analysis, so that only signals from specific sample regions may be detected and so that some multipulse NMR methods may be achieved.

The terminology used in this disclosure is commonly used in the NMR literature.

In an NMR experiment using a single excitation pulse, where this pulse is applied to a coil which provides a grossly inhomogeneous radiofrequency field, the pulse angle varies widely across the sample. If $\theta$ is the pulse angle at a point in the sample, the nuclear magnetization component, which is rotated into the transverse plane of the rotating plane by the pulse, is proportional to $\sin\theta$ and the signal detected using the coil is proportional to $\theta \sin\theta$. Thus the signal intensity from different parts of the sample varies widely. Furthermore, although there is some sample discrimination, in that some regions provide much more signal than others, the signal intensity is only close to zero from small regions where the $\theta$ pulse angle is close to $n\pi(n=0,1,2\ldots)$. For example, one method for obtaining a high resolution NMR spectrum from a selected portion of a larger sample, which has gained recent popularity, involves the use of a surface coil for irradiation and detection, placed on the surface of the sample as near as possible to the sample region which is to be examined. These unconventional coils are often used for whole animal and human NMR studies of metabolism where it is desirable to obtain in vivo spectra from individual tissues and organs lying on the surface or deep within the sample. The geometry of a surface coil determines that the excitation rf pulse angle decreases rapidly with penetration into the sample. For example, the pulse angle drops to one third at a depth of the radius of the surface coil. Clearly it is difficult to obtain definitive quantitative results with such a gross variation of pulse angle, and thus signal intensity, across the sample.

The various techniques of multipulse NMR depend on pulse angles being close to the ideal $\pi/2$ and $\pi$ values. When this is not so a wide variety of artifact or spurious signals are generated. Multipulse NMR using inhomogeneous radiofrequency coils would then seem to be impossible unless some means can be found to discriminate against sample regions where pulse angles diverge markedly from the ideal $\pi/2$ and $\pi$ values.

The prime object of this invention is to provide a means which will discriminate against some sample regions and select other sample regions, to the extent that the signal intensity in the experimental situation is vanishingly small from a large part of the normal sample volume, when using an inhomogeneous irradiation coil such as a surface coil.

It is a further object of this invention that it may be used for the application of various techniques of multipulse NMR using inhomogeneous irradiation coils.

The first object is accomplished in accordance with the invention by use of specific phase-alternated consecutive pulse schemes which require the pulse phases and receiver phase to be alternated in a prescribed way and which require the length of the pulses to be adjusted in a predetermined manner. The second object is accomplished by inserting delay periods in these pulse schemes in a prescribed manner.

PHASE ALTERNATION OF $\pi$ PULSES

In improving the Carr-Purcell method, Meiboom and Gill, Reviews of Scientific Instrumentation, 29, 688 (1958), found that the axis, along which nuclear magnetizations are refocused by a $\pi$ pulse, is inverted if the phase of the $\pi$ pulse is changed by 90° relative to the $\pi/2$ excitation pulse. Bodenhausen et al, Journal of Magnetic Resonance, 27, 511 (1977), used this property to eliminate ghost artifact signals from two dimensional $^{13}C-^{1}H$ J spectra obtained using a spin-echo sequence. The phase of the $\pi$ pulse was alternated by 90° for alternate transients and this was accompanied by alternate inversion of receiver phase. Bodenhausen et al also eliminated phantoms, a second type of artifact signal, by changing the phase of the $\pi$ pulse by 180° without changing the receiver phase. The phase of the $\pi$ pulse was thus shifted through all four 90° shifts (or applied along all four axes of the transverse plane of the rotating plane) with inversion of receiver phase for ±90° phase shifts relative to the initial $\pi/2$ excitation pulse. Here, our shorthand notation for this procedure will be: $\pi[\pm x,\pm y]$.

Although the effect of pulse imperfections in the two-dimensional NMR has led to valuable improvements, the application of schemes such as $\pi[\pm x,\pm y]$ are equally valuable in one-dimensional experiments to remove the effect of pulse imperfections. Consider the simple spin-echo sequence:

$$\pi/2 - \tau - \pi[\pm x, \pm y] - \tau - \text{acquire signal} \quad [A]$$

When using inhomogeneous coils such as surface coils it is more meaningful to write this as $$\theta - \tau - 2\theta[\pm x, \pm y] - \tau - \text{acquire signal} \quad [B]$$

because the pulse angles vary rapidly and continuously across the subject material and are only close to the ideal $\pi/2$ and $\pi$ values in the sample region of interest. A $2\theta$ pulse is defined simply as a pulse which is twice as long as the initial $\theta$ excitation pulse.

Figure 1:
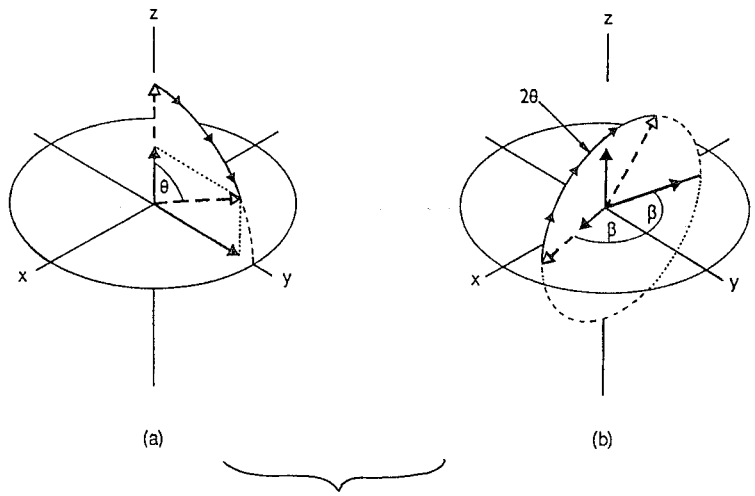
FIG. 1 is a representation of the effect of a $\theta[x]$ pulse on an initial z axis magnetization and secondly a representation of the effect of a $2\theta[y]$ pulse on the y axis component of the initial magnetization subsequent to the $\theta[x]$ pulse and subsequent to precession of the y axis component through an angle of $\beta$ degrees.

After a $\theta[x]$ pulse the initial nuclear magnetization vector will be at an angle, $(\pi/2-\theta)$, to the xy plane of the rotating frame. This can be resolved into two components, a z component of magnitude $\cos\theta$ and a y component of magnitude $\sin\theta$, see FIG. 1(a). The latter precesses during the subsequent $\tau$ period as a result of chemical shift off-resonance and other effects through an angle of $\beta$ degrees say. The effect of the $2\theta$ pulse will be to rotate this $\sin\theta$ component around the pulse axis by an angle of $2\theta$ as indicated in FIG. 1(b). A $2\theta$ pulse, on the y axis say, rotates this vector about the y axis, around the surface of a cone, half apex angle $\beta$ degrees. The vector arrowhead moves $2\theta$ degrees around the circular base of the cone. As shown by Kaiser et al, Journal of Chemical Physics, 60, 2966 (1974), this vector component may be resolved into two xy components, whose magnitudes are independent of the angle the $\sin\theta$ vector component makes to the pulse axis just prior to the $2\theta$ pulse and thus independent of precession during $\tau$, plus a z-axis component. One xy component remains along the direction of the $\sin\theta$ vector prior to the pulse. The second xy component lies in the xy plane at the position the total a vector would take if the $2\theta$ pulse were a perfect $\pi$ pulse. Given that the vector component has magnitude $\sin\theta$ prior to the $2\theta$ pulse, the two xy components after the $2\theta$ pulse have magnitude $(\frac{1}{2})\sin\theta(1+\cos2\theta)$ and $(\frac{1}{2})\sin\theta(1-\cos2\theta)$ respectively, and the z-axis component has magnitude $\sin\theta\sin2\theta\sin\beta$ where $\beta$ is the angle the $\sin\theta$ vector makes to the pulse axis prior to the pulse.

The z-axis component is not acquired in sequence [B] and can be disregarded for the moment. The second xy-component is refocused along the y-axis at the end of the second $\tau$ period if the $2\theta$ pulse is applied along the $\pm y$ axes (e.g. $2\theta[y]$ shown in FIG. 1(b)). Alternatively this xy-component is refocused along the $-y$ axis if the $2\theta$ pulse is applied along the $\pm x$ axes. The signal resulting from this refocused component may be accumulated in sequence [B] by inverting the receiver phase when the $2\theta$ pulse is applied along the $\pm y$ axis. By definition, the direction of the first xy-component is independent of the magnitude and phase of the $2\theta$ pulse and thus may be considered to be unaffected by the $2\theta$ pulse and thus by the phase of the pulse. Consequently, the signal resulting from it is cancelled by the inversion of receiver phase.

The z-axis component (magnitude, $\cos\theta$) left after the $\theta$ pulse, will be partially rotated into the xy plane by the $2\theta$ pulse, leaving a z-axis component after the $2\theta$ pulse of magnitude $\cos\theta\cos2\theta$ and an xy component of magnitude $\cos\theta\sin2\theta$. The former is not acquired in sequence [B]. The phase of the latter is inverted by inversion of the $2\theta$ pulse phase and consequently the signal from this component is cancelled by cycling the $2\theta$ pulse through all four phases because the same receiver phase is retained when the $2\theta$ pulse phase is inverted.

The $(\frac{1}{2})\sin\theta(1+\cos2\theta)$ component corresponds to the ghost signals, and the $\cos\theta\sin2\theta$ component corresponds to the phantom signals found in two-dimensional $^{13}C-^{1}H$ J spectroscopy and eliminated by Bodenhausen et al using the $2\theta[\pm x, \pm y]$ phase-cycling. For one-dimensional spin-echo applications both components will lead to phase errors if not removed by the phase-cycling, because precession in the xy plane resulting from chemical shift off-resonance is not refocused by the $2\theta$ pulse.

For inhomogeneous coils the $2\theta[\pm x, \pm y]$ phase cycling makes possible a number of valuable spin-echo applications as discussed in a later section. A second valuable property can be appreciated by a closer look at the magnitude of the acquired signal:

$$(\tfrac{1}{2})\sin\theta(1-\cos2\theta) = \sin^3\theta$$

Figure 2:
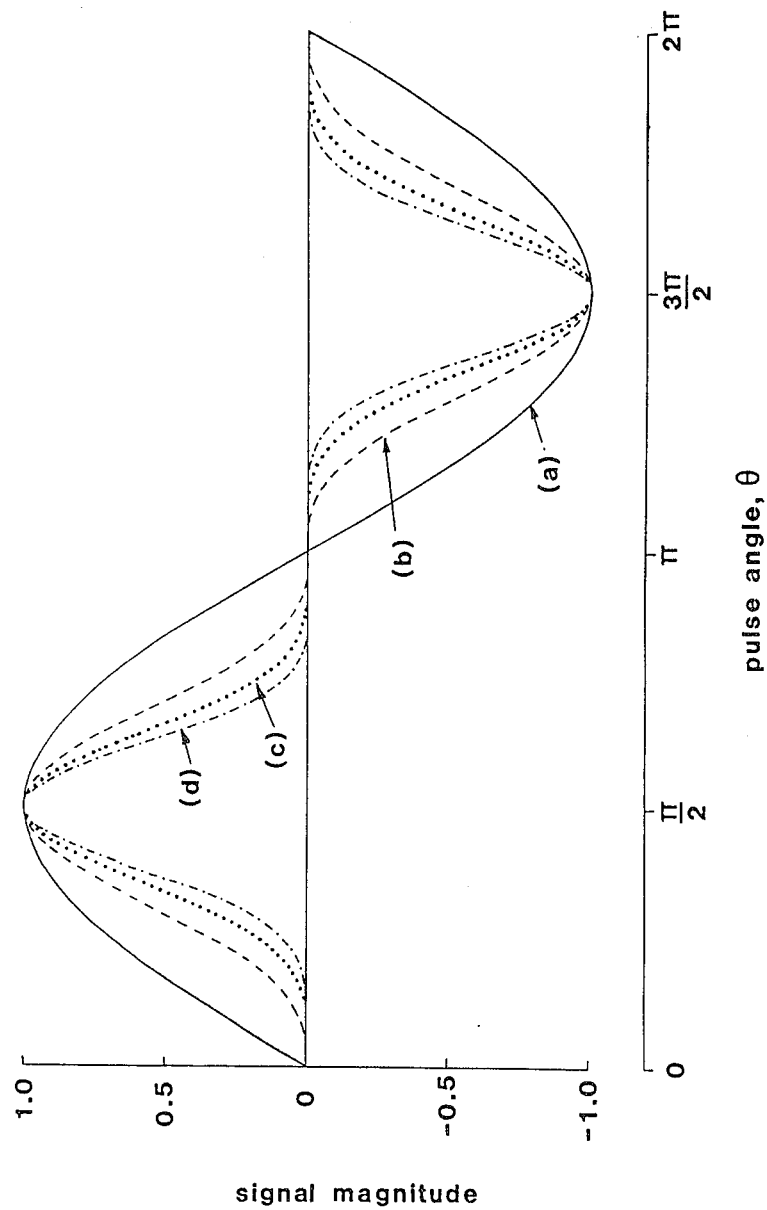
FIG. 2 shows plots of signal magnitude, as a function of the pulse angle $\theta$, following a single radiofrequency pulse and various depth pulses, $\theta;(2\theta[\pm x,\pm y])_n$, where $n=1,2,3$.

From a plot of $\sin^3\theta$ versus $\theta$, FIG. 2(b), it can be seen that for large divergences of $\theta$ from $\pi/2$ the acquired signal is considerably smaller than would be obtained if a single $\theta$ pulse were used, FIG. 2(a). Thus sequence [B] discriminates against sample regions where the pulse angle is different from $\pi/2$, to a much greater extent than a single excitation pulse. This can be used to advantage by setting $\theta$ to obtain the maximum signal from a certain sample region, or at a certain depth from the surface coil for instance, so minimizing the signal from either side of this region. Sequence [B] may thus be called a "depth sequence".

As already noted, the magnitude of the signal from sequence [B] is independent of the length of the $\tau$ waiting periods and so the $\tau$ periods may be removed altogether. There remains a complicated excitation pulse, $\theta; 2\theta[\pm x, \pm y]$, which retains the valuable property of discriminating against sample regions where $\theta$ is divergent from $\pi/2$. We call this a "depth pulse".

The depth characteristics can be further improved by adding more $2\theta[\pm x, \pm y]$ pulses. In general, for a $\theta; (2\theta[\pm x, \pm y])_n$ pulse the magnitude of the acquired signal is $\sin^{n+1}\theta$. For example, consider $\theta; 2\theta[\pm x, \pm y]; 2\theta[\pm x, \pm y]$. Clearly, for the phase-cycling to function properly the phase-cycling of the second $2\theta$ pulse must be independent of the phase-cycling of the first $2\theta$ pulse. That is, for every phase used for the first $2\theta$ pulse all four phases must be used for the second $2\theta$ pulse, or vice versa. A phase-cycle of 16 different combinations is thus required. In general, for $\theta; (2\theta[\pm x, \pm y])_n$, $4^n$ different combinations are necessary.

Consider $\theta; 2\theta[\pm x, \pm y]; 2\theta[\pm x, \pm y]$, i.e. $\theta; (2\theta[\pm x, \pm y])_2$, in terms of magnetization vectors. Individual vector components may be considered as above for a single $2\theta[\pm x, \pm y]$ pulse, however generalizations can be made. The 90° phase shifts of the second $2\theta$ pulse accompanied by inversion of receiver phase will cancel any xy vector component which is unaffected by this pulse. Any xy vector component which is unaffected by the first $2\theta$ pulse is similarly cancelled by the independent 90° phase shifts of that pulse. Any z vector component left after the first $2\theta$ pulse (including both the $\sin\theta\sin2\theta\sin\beta$ and $\cos\theta\cos2\theta$ components), which is rotated into the xy plane by the second $2\theta$ pulse, is inverted by the 180° phase shifts of this pulse and is cancelled because the same receiver phase is retained. Any transverse magnetization resulting from the $\sin\theta \sin2\theta \sin\beta$ z-axis component is cancelled by inversion of the $2\theta$ pulse, provided delay times and magnetic field inhomogeneity (and thus $\beta$) is constant between different transients, as is normally the case. The only signal that is accumulated over the 16 transient cycle corresponds to the magnetization component which is rotated into the xy plane by the $\theta$ pulse (component proportional to $\sin\theta$) and then affected by the $2\theta$ pulses as though they were $\pi$ pulses (proportional to $(\frac{1}{2})(1-\cos2\theta)$ for each $2\theta$ pulse). The final signal is thus proportional to $$\sin\theta[(\tfrac{1}{2})(1-\cos2\theta)]^2 = \sin^5\theta.$$

The improvement expected by adding a second and third $2\theta[\pm x, \pm y]$ pulse is shown in FIG. 2(c) and FIG. 2(d) respectively, FIG. 2(c) showing the $\theta$ dependence of $\sin^5\theta$ and FIG. 2(d) showing the $\theta$ dependence of $\sin^7\theta$. The improvement is less for each additional pulse and it is probably not worthwhile adding the third $2\theta[\pm x, \pm y]$ pulse considering the factor of 4 increase in phase combinations.

Figure 3:
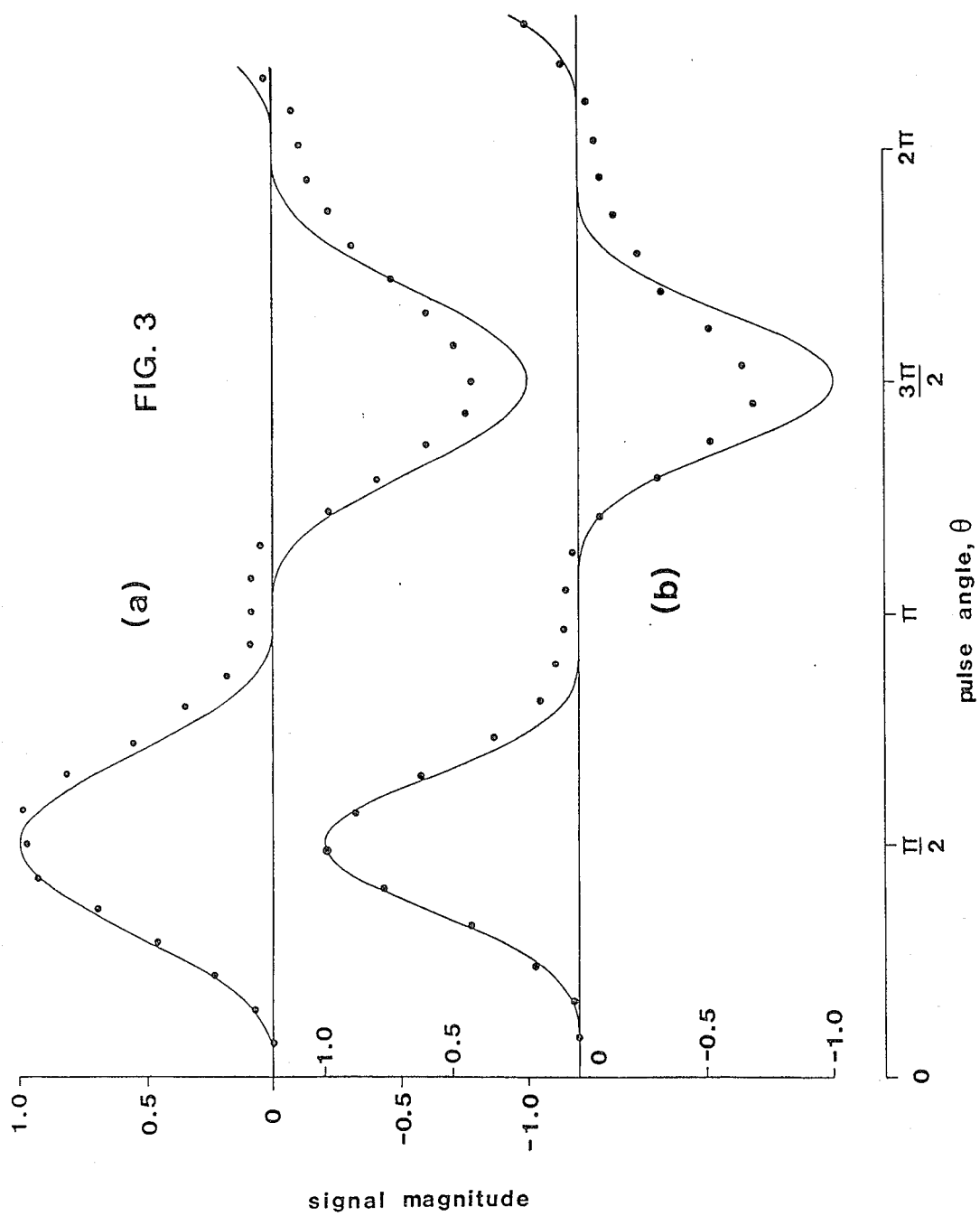
FIG. 3 shows experimental results (points) in comparison to theoretical curves for the depth pulse $\theta 2\theta[\pm x,\pm y]$ and secondly for the depth pulse $\theta;(2\theta[\pm x,\pm y])_2$.

Experimental verification of the above is provided in FIG. 3(a) for the depth pulse $\theta;2\theta[\pm x, \pm y]$ and in FIG. 3(b) for the depth pulse $\theta;(2\theta[\pm x, \pm y])_2$. These results were obtained using a standard 10 mm broadband probe in a high-resolution Bruker CXP-300 spectrometer. Each experimental point is the average intensity of four resonances in the $^{13}$C spectrum of a concentrated solution of cholesterol in CDCl$_3$ at 25° C. The sample was not restricted to the dimensions of the irradiation/detection saddle-coil. Although the pulses for this system are sufficiently homogeneous across the sample to verify the expected signal versus pulse angle dependence, the effect of pulse inhomogeneity becomes more obvious for longer pulses. For example, when the main sample region feels a $\pi$ pulse, and thus produces a nil signal, the edge of this sample region will feel a smaller pulse angle and so produce a positive signal amplitude. If a rf pulse were homogeneous across the sample region, the signal amplitude after a $\theta;(2\theta[\pm x, \pm y])_n$ pulse when $\theta = \pi/2$ would be identical to that provided by a single $\pi/2$ pulse, because no signal components would be cancelled by the phase alternation. However, experimentally $\theta;2\theta[\pm x, \pm y]$ and $\theta;(2\theta[\pm x, \pm y])_2$ pulses gave signal amplitudes of 86.7±4.3% and 86.8±2.6% respectively when $\theta = \pi 2$ (experimentally $\theta = \pi 2$ corresponds to the maximum obtainable signal), compared to the signal after a single $\pi/2$ pulse. This also illustrates a modest rf inhomogeneity across the sample.

Similar results were obtained if $\tau$ periods were used, in agreement with theory. For spin-echo applications, it is only necessary to place the last $2\theta[\pm x, \pm y]$ pulse at the centre of the total delay period to achieve complete refocusing of chemical shift off-resonance. As expected, no $\tau$ dependent phase roll was observed across the spectrum. This is discussed in a later section.

These results are equivalent to those that would be obtained with a surface coil for a small phantom volume element.

PHASE ALTERNATION IN INVERSION-RECOVERY EXPERIMENTS

The most common application of pulse phase alternation to date is the phase inversion of the $\pi/2$ pulse in the $\pi$-$\tau$-$\pi/2$ inversion-recovery $T_1$ sequence, introduced by Demco et al, Journal of Magnetic Resonance, 16, 467 (1974). This phase alternation is accompanied by inversion of receiver phase and is used to remove the effects of imperfect pulses.

Consider an inversion-recovery sequence where the pulses diverge from $\pi$ and $\pi/2$ as would be the case for inhomogeneous coils:

$$2\theta - \tau - \theta[\pm x], \text{ acquire signal} \qquad [C]$$

Figures 4, 9:
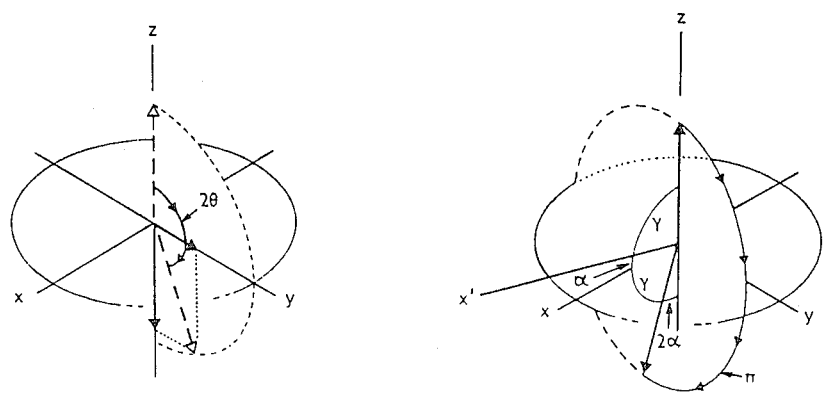
FIG. 4 is a representation of the effect of a $2\theta[x]$ pulse on an initial z axis magnetization.
FIG. 9 is a representation of the effect of a weak off-resonance $\pi[x]$ pulse on an initial z axis magnetization.

The situation after the $2\theta$ pulse is shown in FIG. 4. The xy component of magnetization, magnitude $\sin2\theta$, will precess during $\tau$ as a result of chemical shift off-resonance. The $\theta$ pulse will leave a part or all of this vector component in the xy plane, depending on the extent of the prior precession, leading to phase and intensity errors in the final signal. However, from a simple three-dimensional model of the kind shown in FIG. 4 it can be readily seen that for any $\theta$ pulse phase (or any degree of precession of the $\sin2\theta$ vector) the xy component of the $\sin2\theta$ vector after the $\theta$ pulse will be the same as when the pulse phase is inverted. After precession of the $\sin2\theta$ component in the xy plane the action of any pulse, or a pulse of inverse phase, may be viewed respectively as clockwise or anticlockwise rotation of the $\sin2\theta$ component around the pulse axis. Thus for strong pulses, any pulse or its inverse must leave the same component of the $\sin2\theta$ vector in the xy plane. Consequently, the accompanying inversion of receiver phase cancels this unwanted xy component as Demco et al found.

The $\cos2\theta$ component along the $-z$ axis is rotated by the $\theta$ pulse to give an xy component of magnitude $(-\cos2\theta \sin\theta)$. The phase of this component is inverted if the $\theta$ pulse phase is inverted, so the signal will be accumulated if the receiver phase is also inverted, thus giving a final signal of magnitude proportional to $(-\cos2\theta \sin\theta)$. This signal magnitude is independent of $\tau$.

Figure 5:
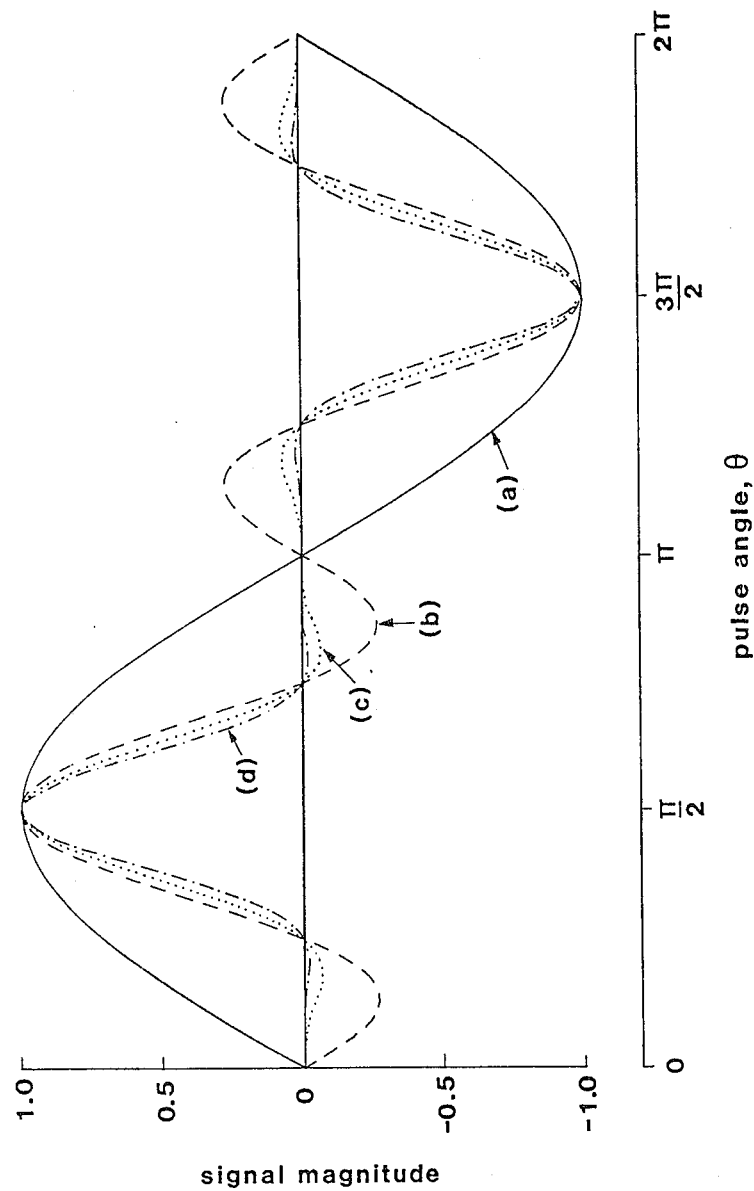
FIG. 5 shows plots of signal magnitude, as a function of the pulse angle $\theta$, following a single radiofrequency pulse and the combined pulses, $2\theta;\theta[\pm x]$ and $2\theta;\theta[\pm x];(2\theta[\pm x,\pm y])_n$, where $n=1,2$.

The dependence of $-\cos2\theta \sin\theta$ on $\theta$ is plotted in FIG. 5(b) for comparison to a single pulse in FIG. 5(a) ($\sin\theta$). The shape of the curve raises the possibility that sequence [C] (with $\tau = 0$) might also be used as a depth pulse especially if the negative wings at $0 < \theta < 45°$ and $135° < \theta < 180°$ can be reduced by adding $2\theta[\pm x, \pm y]$ pulses. Provided the $\theta[\pm x]$ phase alternations are independent of the $2\theta[\pm x, \pm y]$ phase cycling, the signal magnitude for the combined pulse $2\theta;\theta[\pm x];(2\theta[\pm x, \pm y])_n$ is $(-\cos2\theta \sin^{2n+1}\theta)$ and $2\times 4^n$ pulse phase combinations are required. This magnitude formula is obtained by replacing $\sin\theta$ by $(-\cos2\theta \sin\theta)$ in the formula given in the previous section for $\theta;(2\theta[\pm x, \pm y])_n$, because the $\theta$ excitation pulse has been replaced by $2\theta;\theta[\pm x]$.

The $\theta$ dependence of the signal magnitude for the combined pulses, $2\theta;\theta[\pm x];2\theta[\pm x, \pm y]$ and $2\theta;\theta[\pm x];(2\theta[\pm x, \pm y])_2$ is shown in FIG. 5(c) and FIG. 5(d) respectively. Clearly the addition of the $2\theta[\pm x, \pm y]$ pulses does reduce the negative wings as hoped. It is counter-productive to add more than two such pulses because the wings are reduced to about 1% of maximum amplitude with two pulses. Furthermore, the improvement gets less with each additional pulse whilst the number of phase combinations increases by a factor of 4.

Figure 6:
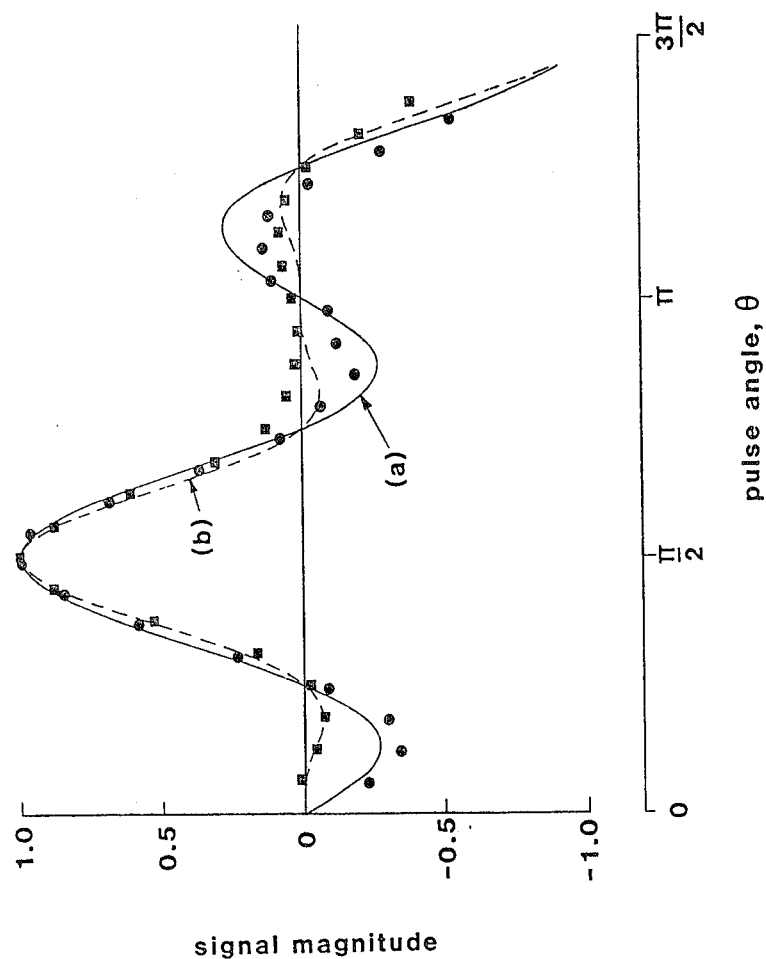
FIG. 6 shows experimental results in comparison to theoretical curves for the combined pulses $2\theta;\theta[\pm x]$ and $2\theta;\theta[\pm x];2\theta[\pm x,\pm y]$.
Figure 7:
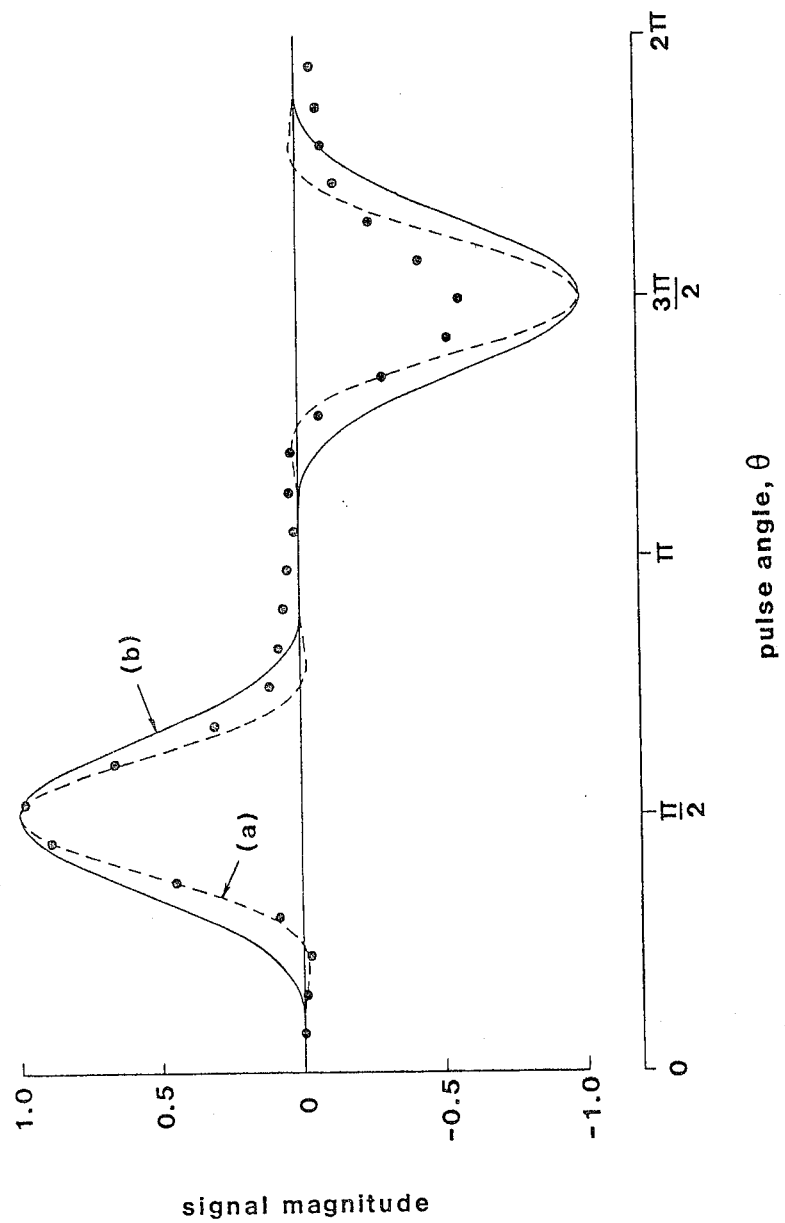
FIG. 7 shows experimental results in comparison to theoretical curves for the depth pulse $2\theta;\theta[\pm x];(2\theta[\pm x,\pm y])_2$.

Experimental verification of the signal magnitude formulae for the combined pulses $2\theta;\theta[\pm x]$ (points) and $2\theta;\theta[\pm x];2\theta[\pm x, \pm y]$ (squares) is shown in FIG. 6 and for $2\theta;\theta[\pm x];(2\theta[\pm x, \pm y +])_2$ in FIG. 7. These results were obtained in the same way as described for those in FIG. 3. As before, radiofrequency pulse inhomogeneity becomes more obvious for longer pulses, although the extra discrimination afforded by $2\theta;\theta[\pm x];(2\theta[\pm x,\pm y])_2$ is shown by the near nil signal at $\theta=\pi$(FIG. 7). As for the depth pulses of the previous section, these combined pulses also show a modest reduction of signal amplitude, when $\theta=\pi/2$, compared to a single $\pi/2$ pulse because of radiofrequency inhomogeneity across the sample. For the spectrometer probe used, the amplitudes were $87.0\pm3.3\%$ ($2\theta;\theta[\pm x]$), $77.2\pm4.4\%$ ($2\theta;\theta[\pm x];2\theta[\pm x,\pm y]$) and $76.7\pm6.9\%$ ($2\theta;\theta[\pm x];(2\theta[\pm x,\pm y])_2$).

The $\theta$ dependence of $\theta;(2\theta[\pm x,\pm y])_2$ is also plotted in FIG. 7 for comparison. Clearly the substitution of $2\theta;\theta[\pm x]$ leads to a substantial improvement with only a factor of two increase in the phase combinations required. The depth pulse $2\theta;\theta[\pm x];(2\theta[\pm x,\pm y])_2$ is the optimum combined pulse, found in this study, for discriminating against sample regions where pulse angles differ from ideal $\pi/2$ and $\pi$ values. To obviate any possibility of ambiguity the phase cycle for this depth pulse is given in Table 1. Note that if a four phase quadrature compensation cycle is used, this must also be achieved independently. That is, the number of phase combinations is four times more than that given in Table 1.

TABLE 1

Relative pulse phases for the depth pulse, $\theta;(2\theta[\pm x,\pm y])_2$[a] and for the last three pulses in the depth pulse, $2\theta;\theta[\pm x];(2\theta[\pm x,\pm y])_2$[b]

| Receiver | Add (+) | | | Subtract (−) | | |
|---|---|---|---|---|---|---|
| Pulses | $\theta$ | $2\theta$ | $2\theta$ | $\theta$ | $2\theta$ | $2\theta$ |
| Pulse | x | x | x | x | y | x |
| phases | x | −x | x | x | −y | x |
|  | x | x | −x | x | y | −x |
|  | x | −x | −x | x | −y | −x |
|  | x | y | y | x | x | y |
|  | x | −y | y | x | −x | y |
|  | x | y | −y | x | x | −y |
|  | x | −y | −y | x | −x | −y |
|  | −x | y | x | −x | x | x |
|  | −x | −y | x | −x | −x | x |
|  | −x | y | −x | −x | x | −x |
|  | −x | −y | −x | −x | −x | −x |
|  | −x | x | y | −x | y | y |
|  | −x | −x | y | −x | −y | y |
|  | −x | x | −y | −x | y | −y |
|  | −x | −x | −y | −x | −y | −y |

[a]Top 16 combinations only.
[b]The phase of the first $2\theta$ pulse is not important.

Where it is instrumentally difficult to invert the receiver phase, the equivalent of this may be achieved in either of two ways. Transients from phase combinations requiring receiver phase inversion may be accumulated into a second computer memory block and subtracted from the other half of the total transients at the completion of the acquisition. Alternatively, the inversion of all pulse phases in a phase combination is equivalent to inversion of receiver phase. For example, the first phase combination for the $2\theta;\theta[\pm x];(2\theta[\pm x,\pm y])_2$ pulse in Table 1 which requires inverted receiver phase is $2\theta[x];\theta[x];2\theta[y];2\theta[x]$. Its equivalent is $2\theta[-x];\theta[-x];2\theta[-y];2\theta[-x]$ without receiver phase inversion.

Another alternative, based on the principle that inversion of all pulse phases is equivalent to inversion of receiver phase, may be generated by reconsidering sequence [C] where the $\theta[\pm x]$ alternation is accompanied by inversion of receiver phase. The equivalent of $2\theta[x]-\tau-\theta[-x]$, acquire with inverted receiver phase is $2\theta[-x]-\tau-\theta[x]$, acquire with the same receiver phase. Consequently in all the above combined and depth pulses $2\theta;\theta[\pm x]$ may be replaced by $2\theta[\pm x];\theta$ such that the same receiver phase is retained when the $2\theta$ pulse is phase-alternated. Thus we have the depth pulse $2\theta[\pm x];\theta;(2\theta[\pm x,\pm y])_n$ which also gives a signal magnitude of $(-\cos 2\theta \sin^{2n+1}\theta)$ and for which $2\times 4^n$ pulse phase combinations are required, but inversion of receiver phase is only necessary when the $2\theta$ pulse phases are changed by 90°. Thus for the depth pulse $2\theta[\pm x];\theta;(2\theta[\pm x,\pm y])_n$ the phase combinations are the same as those given in Table 1 where now the $\theta$ column actually shows the phases of the $2\theta$ pulse and where the bottom left-hand quadrant should be swapped for the bottom right-hand quadrant to account for the changed status of the receiver phase. $2\theta;\theta[\pm x]$ may be replaced by $2\theta[\pm x];\theta$ in all the following applications.

OFF-RESONANCE EFFECTS

So far we have ignored the possible effects of pulses being non-ideal when applied off-resonance. A weak off-resonance pulse may be thought of as one which rotates a magnetization vector around an axis which is tilted away from the xy plane towards the z axis, as discussed by Freeman et al, Journal of Magnetic Resonance, 38, 453 (1980). The stronger the pulse (the shorter the $\pi/2$ pulse time), the less the tilt. These tilts complicate the vector model illustrated in FIGS. 1 and 4 and complicate the quantitative analysis of the signal amplitude resulting from the above pulse sequences and depth pulses. Rather than attempt this analysis here we have taken an experimental approach because, provided rf pulses are sufficiently strong, the tilt may be ignored. In the above experimental tests $\pi/2$ pulse times were approximately 30 μsec and the tests were made across a shift range of $\pm 2,300$ Hz. The lack of any deleterious off-resonance effects, as discussed below, under these severe conditions obviates the need for a detailed analysis.

The experimental signal intensity versus $\theta$ curves in FIGS. 2, 3, 6 and 7 were obtained from the average intensities of four $^{13}CH_n$ groups, two close to on-resonance and two at approximately 2,300 Hz off-resonance. All resonances within the spectral width used showed the same intensity dependence on $\theta$ as these four resonances.

Figure 8:
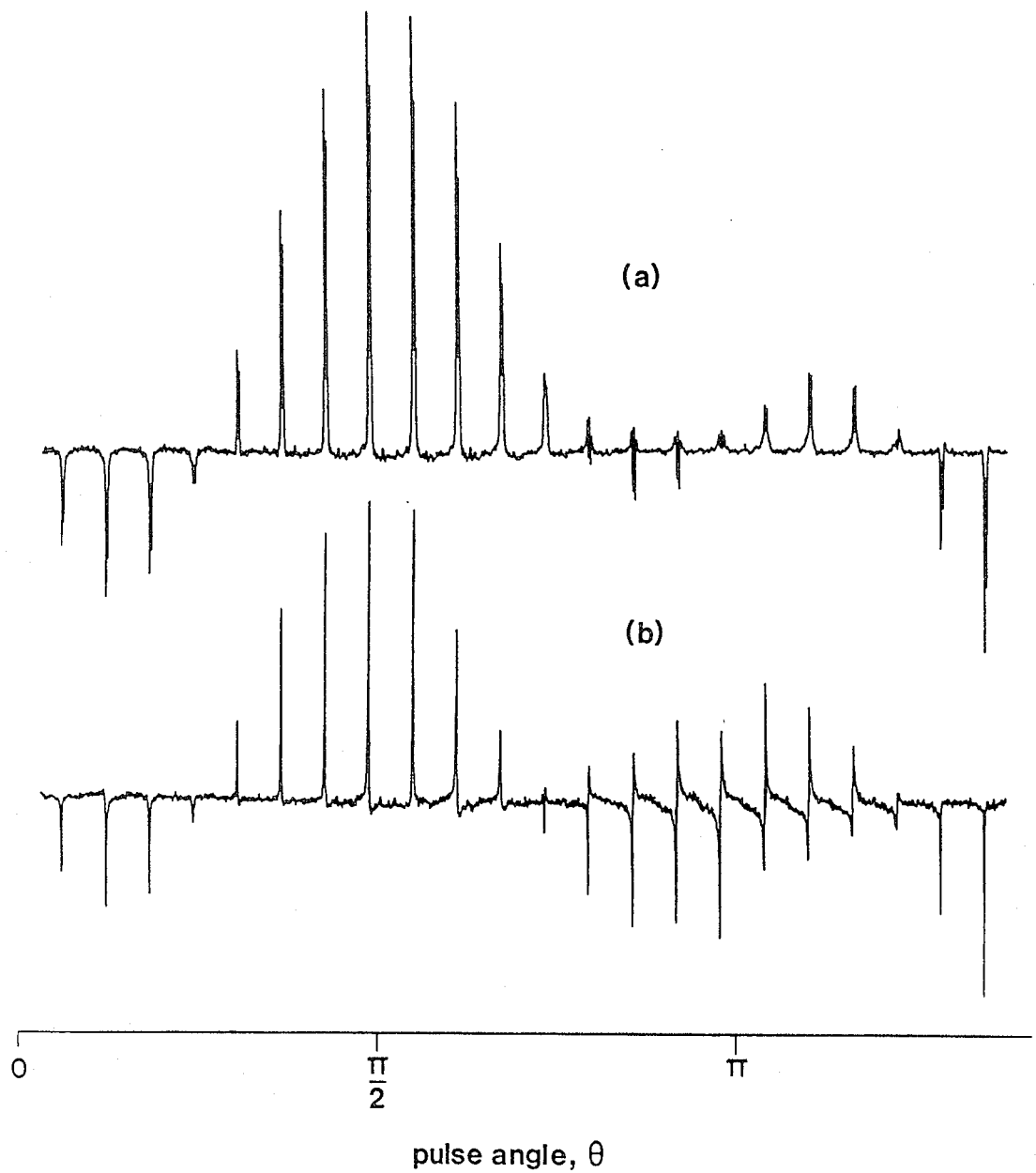
FIG. 8 shows spectra obtained for two cholesterol signals close to resonance and secondly for a cholesterol signal about 2000 Hz off-resonance, as a function of the pulse angle $\theta$, for the combined pulse $2\theta;\theta[\pm x]$.
Figure 10:
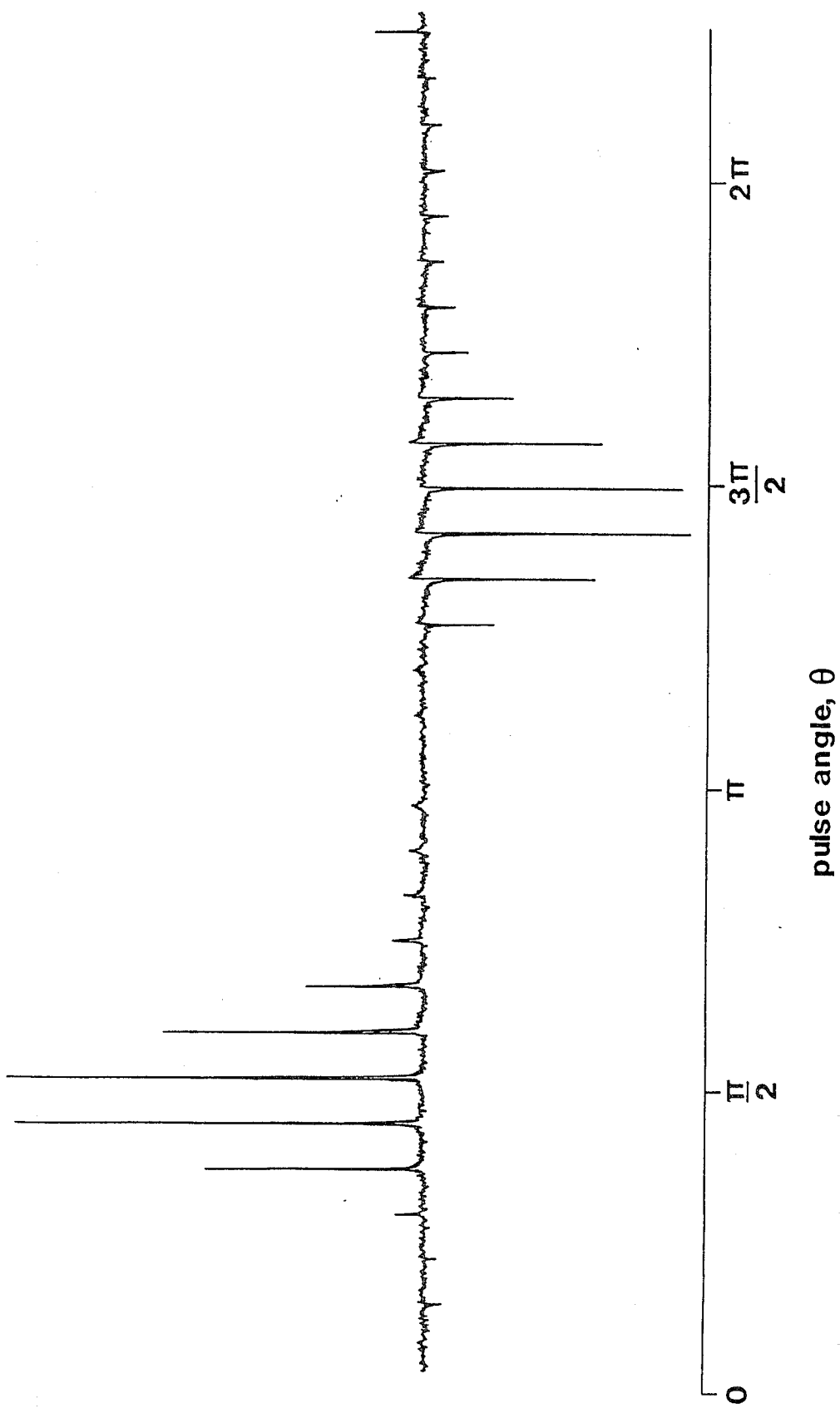
FIG. 10 shows spectra obtained for a cholesterol signal about 2000 Hz upfield of resonance, as a function of the pulse angle $\theta$, for the combined pulse $2\theta;\theta[\pm x];(2\theta[\pm x,\pm y])_2$.

The combined pulse, $2\theta;\theta[\pm x]$ did give a substantial dispersion signal for off-resonance peaks for $\theta$ values around $\pi$. This is illustrated in FIG. 8. These results were obtained in the same way as described for those in FIG. 3. The origin of this dispersion signal, which is 90° out of phase to the normal signal, can be appreciated from FIG. 9. When $\theta=\pi$, the $2\theta$ pulse is a $2\pi$ pulse which rotates the initial magnetization back to its original position even when the pulse is a weak off-resonance one. The subsequent $\pi$ pulse rotates the magnetization vector around the tilted effective field axis, $x^1$ (around the surface of a cone, half apex angle, $\gamma=\pi/2-\alpha$) leaving it an angle ($2\alpha$) to the $-z$ axis which is twice the tilt of the effective field. Thus, instead of giving a zero signal, this magnetization has a component of magnitude proportional to $\sin 2\alpha$ in the xy plane. This component is along the x (or −x) axis rather than the $\pm y$ axis for the normal signal (when $\theta=\pi/2$) and thus gives a dispersion signal. Fortunately, experiment also showed that addition of one or more $2\theta[\pm x,\pm y]$ pulses eliminated this error signal. FIG. 10 shows data for $2\theta;\theta[\pm x];(2\theta[\pm x,\pm y])_2$ comparable to FIG. 8. The dispersion signal at $\theta=\pi$ is now absent. It should be remembered that there is no intention of using $2\theta;\theta[\pm x]$ pulses for inhomogeneous coils.

In FIG. 10 small phase errors of a few degrees can be seen for signals when $\theta$ is around $3\pi/2$. Although these errors are hardly larger than random experimental phase errors, they are real and are an off-resonance effect. Errors of opposite phase occur for signals downfield of on-resonance, whereas on-resonance signals show only random experimental errors. These small phase errors were also observed for resonances far off-resonance when using $\theta;2\theta[\pm x,\pm y]$, $\theta;(2\theta[\pm x,\pm y])_2$ and $2\theta;\theta[\pm x];2\theta[\pm x,\pm y]$ pulses. Although an off-resonance effect, these errors may not be caused by tilt of the effective field but could easily result from other experimental factors, for example from chemical shift precession during the finite length of the $2\theta$ pulses. These small phase errors are not a problem. Any small phase roll such as this across the spectrum would be corrected during the normal phase correction procedure.

The combined pulse $2\theta;\theta[\pm x]$ also gives small intensity differences across a spectrum, even though this difference is not detectable in the $\theta$ dependence of FIG. 6. For example, at $\theta=\theta/2$ eight resonances within ±400 Hz off-resonance had a signal intensity of 89.8±0.8% compared to those after a single $\pi/2$ pulse. In comparison, four peaks within ±(1600–2300) Hz off-resonance had intensities of 81.2±2.8%. No similar significant difference was observed for the $\theta;2\theta[\pm x,\pm y]$ or $\theta;(2\theta[\pm x,\pm y])_2$ pulses although the best depth pulse, $2\theta;\theta[\pm x];(2\theta[\pm x,\pm y])_2$ did show a difference of about 5% across the spectrum. Such small errors are not a cause for concern.

Finally it should be noted that the off-resonance effects that were observed, or the lack of them, were independent of any $\tau$ delay periods between the individual pulses in these pulse schemes.

THE DEPTH PULSE, $2\theta;\theta[\pm x];(2\theta[\pm x,\pm y])_2$.

As an example of the degree of sample discrimination that can be achieved using an inhomogeneous radiofrequency coil, calculations were made for a surface coil starting with the known variation of pulse angle at various distances from the coil, M.W. Garrett, Oak Ridge National Laboratory Publication, ORNL 3575, 8 (1965). When the $\theta$ pulse angle is 225° at the centre of the coil, it is 90° at 0.9 radii distance from the centre of the coil, on the coil axis. Thus maximum signal intensity arises from nuclei at 0.9 radii depth using a $2\theta;\theta[\pm x];(2\theta[\pm x,\pm y])_2$ pulse. However, the signal intensity is less than 1% of maximum for depths less than 0.6 radii and more than 1.4 radii along the coil axis. In comparison, a single $\theta$ excitation pulse, which is 270° at the coil centre, also produces a maximum signal at 0.9 radii depth along the coil axis. However, the signal intensity only falls to less than 1% of this maximum at depths beyond 2.5 radii. Furthermore, at shallower depths the signal intensity crosses zero intensity at 0.55 radii depth and becomes large and negative at the coil centre, where this negative signal is 2.5 times as large as the positive maximum at 0.9 radii. Clearly, the depth pulse shows good sample discrimination whereas in this case the single $\theta$ pulse shows no discrimination.

Finally, it should be noted that the $2\theta$ pulses may be varied from being twice the $\theta$ pulse and from being equal to each other in the depth pulses $\theta;(2\theta[\pm x,\pm y])_n$ and $2\theta;\theta[\pm x];(2\theta[\pm x,\pm y])_n$. For example, for the depth pulse $2\theta_1;\theta[\pm x];2\theta_2[\pm x,\pm y];2\theta_3[\pm x,\pm y]; \ldots ;2\theta_n[\pm x,\pm y]$ the signal intensity is proportional to $\cos2\theta_1 \sin\theta \sin^2\theta_2 \sin^2\theta_3 \ldots \sin^2\theta_n$. However, variation of the $2\theta$ angles in this way will in general result in a reduction of signal intensity from the sample region of interest.

INVERSION-RECOVERY $T_1$ MEASUREMENTS

Experiments were conducted to test whether the sequence, sequence [D]

$$2\theta-\tau-\theta[\pm x];(2\theta[\pm x,\pm y])_2, \text{acquire signal} \qquad [D]$$

will be useful for accurate $T_1$ measurements when using inhomogeneous coils such as surface coils. From the foregoing theory, at particular values of $\theta$, the signal intensity should vary between $\cos2\theta \sin^5\theta$, at small $\tau$ values, and $\sin^5\theta$ at $\tau$ values considerably longer than the relaxation time. The recovery from the inverted, $\cos2\theta \sin^5\theta$, signal to the $\sin^5\theta$ signal should follow the normal exponential ($e^{-\tau/T_1}$) form. If $\theta=\pi/2$ the signal intensity is initially $-1$ units, and this recovers to $+1$ units at long $\tau$ times in the same way as for a normal inversion-recovery sequence. The total intensity change is thus 2 units. For surface or other inhomogeneous coils where $\theta$ might take all values, the total signal intensity change from a particular sample region will be $(-\cos2\theta \sin^5\theta + \sin^5\theta)$, and thus its relative contribution to the total signal is $\frac{1}{2}(-\cos2\theta \sin^5\theta + \sin^5\theta)$. Consequently the depth characteristics of sequence [D] are given by the average of the $\theta$ dependence curves for $2\theta;\theta[\pm x];(2\theta[\pm x,\pm y])_2$ and $\theta;(2\theta[\pm x,\pm y])_2$, i.e. the average of FIG. 2(c) and FIG. 5(d) or the average of FIGS. 7(a) and 7(b). Thus sequence [D] will show slightly degraded sample discrimination compared to a $2\theta;\theta[\pm x];(2\theta[\pm x,\pm y])_2$ depth pulse Considering the lack of any major off-resonance effects for the pulses $\theta;(2\theta[\pm x,\pm y])_2$ and $2\theta;\theta[\pm x];(2\theta[\pm x,\pm y])_2$ (as discussed above), $T_1$ measurements using sequence [D] are also expected not to be affected in any major way by off-resonance effects.

To test sequence [D], $T_1$ measurements were conducted on twelve well-resolved signals in the cholesterol spectrum, whose $T_1$'s varied between 0.3–0.6 sec, and which were up to 1500 Hz off-resonance. $T_1$'s were measured using sequence [D] with $\theta=\pi/2$ and with the normal, $\pi-\tau-\pi/2[\pm x]$, sequence. The average ratio of the sequence [D] measurements to the normal measurements was 1.01±0.02. The sequence [D] measurements were repeated with the $\theta$ pulse time reduced to 53°, giving an average ratio of 1.04±0.12. The latter represents a successful stringent test of the method. The larger standard deviation of the average, results from the smaller limits of signal variation (given by $\frac{1}{2}(-\cos2\theta \sin^5\theta + \sin^5\theta)$) at this reduced $\theta$ value. This variation is only 0.2 of that when $\theta=\pi/2$ and consequently 25 times more transients would need to be accumulated to obtain the same accuracy of measurement. No deleterious off-resonance effects were observed (e.g. no phase errors).

The two experiments are equivalent to the measurement of $T_1$ values of two phantom samples using a surface coil for which the initial inversion pulse is 180° and 106°. The constant phase characteristics found for off-resonance signals, as illustrated in FIG. 10, guarantee that the signals from two such phantoms would add coherently.

SPIN-ECHO METHODS

The depth pulse, $2\theta;\theta[\pm x];(2\theta[\pm x,\pm y])_2$, may be extended for use as a spin-echo sequence by placing one or both of the $2\theta[\pm x,\pm y]$ pulses at the centre or centres of the spin-echo delay $\tau$ periods. For example, $-\tau-(2\theta[\pm x,\pm y])_2-\tau$ or $-\tau/2-2\theta[\pm x,\pm y]-\tau-2\theta[\pm x,\pm y]-\tau/2$ are possibilities. However, only one such pulse is required during the $\tau$ periods and nothing is gained by using both. Consequently the basic spin-echo sequence is $2\theta;\theta[\pm x];2\theta[\pm x,\pm y]-\tau-2\theta[\pm x,\pm y]-\tau-$acquire signal  [E]

The depth characteristics of this sequence are unchanged by the $\tau$ periods and so the $\theta$ dependence is given by $-\cos2\theta \sin^5\theta$ (FIG. 5(d) or 7(a)). The magnetization vector component accumulated using the sequence is affected by the last $2\theta[\pm x,\pm y]$ pulse as though it were a perfect $\pi$ pulse. Consequently, any coherent precession of magnetization vectors in the xy plane of the rotating reference frame during $\tau$, is refocused by this pulse. Thus, for example, chemical shift off-resonance, heteronuclear coupling and $B_0$ inhomogeneity is refocused and eliminated from the $\tau$ delay period. This enables application of some multipulse techniques using inhomogeneous radiofrequency coils. Some heteronuclear examples follow.

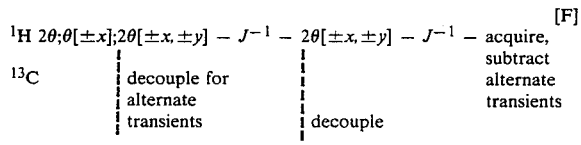

Sequence [F] would provide a $^1H$ spectrum of only those $^1H$ nuclei directly bonded to $^{13}C$ nuclei. J is the single-bond $^1H-^{13}C$ coupling constant. Sequence [F] should be extremely useful in in vivo $^{13}C$ enrichment studies.

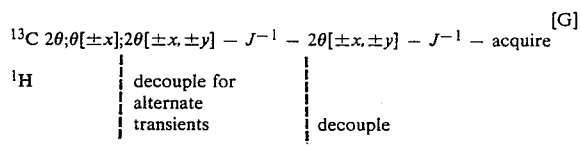

The simple spin-echo equivalent of sequence [G] has found widespread use in high resolution liquid state NMR for editing $^{13}C$ spectra. Addition of alternate transients yields a methylene/quaternary subspectrum and subtraction yields a methyl/methine subspectrum. The former can be separated into methylene and quaternary subspectra by obtaining a quaternary/$\frac{1}{3}$ methylene subspectrum using sequence [H]. These sequences will also be useful in $^{13}C$ NMR of whole animals and humans.

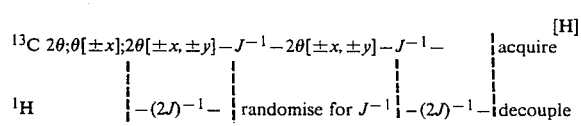

In the foregoing it has been shown for an NMR experiment that alternation of a $2\theta$ pulse through all four 90° phase shifts, as described by Bodenhausen et al, subsequent to a $\theta$ pulse may be used to select some sample regions and discriminate against others when the pulses are applied with an inhomogeneous radiofrequency coil. This represents a new use of a known process.

In addition it has been shown that this sample discrimination can be further improved by addition of more phase-alternated pulses and by pre-application of a $2\theta$ pulse accompanied by suitable phase alternation of the $\theta$ pulse. These combined pulses, or depth pulses, written as $\theta;(2\theta[\pm x,\pm y])_n$ and $2\theta;\theta[\pm x];(2\theta[\pm x,\pm y])_n$ represent entirely new processes.

Finally, it has been shown that these combined pulses may be used for spin-echo techniques by placing one or more of the $2\theta[\pm x,\pm y]$ pulses at the centre or centres of the spin-echo delay periods, although it is only necessary to use one such pulse as a refocusing pulse. It has also been shown that $2\theta;\theta[\pm x];(2\theta[\pm x,\pm y])_n$ may be used for inversion-recovery $T_1$ measurements by inserting an incremented relaxation delay period after the first $2\theta$ pulse.

While the invention has been particularly shown and described with reference to a preferred embodiment thereof, it will be understood by those skilled in the art that the foregoing and other changes in form and details may be made therein without departing from the spirit and scope of the invention.

What is claimed is:

1. A method of analysing a sample by pulsed nuclear magnetic resonance using a radiofrequency irradiation and detection coil which provides an inhomogeneous radiofrequency field, comprising reducing nuclear magnetic resonance signals from regions where a single radiofrequency pulse angle differs from $\pi/2$ radians by applying a second pulse after a first pulse prior to signal detection by a receiver, wherein the second pulse has a pulse angle twice as large as the pulse angle of the first pulse and the phase of the second pulse is alternated through all four 90° phase shifts during subsequent transients such that an equal number of transients are acquired for each of the four phase shifts, and wherein the receiver phase is inverted when the phase of the second pulse is shifted +90° or -90° relative to the phase of the second pulse used for the first transient.

2. A method as claimed in claim 1 wherein nuclear magnetic resonance signals from regions where a single pulse angle differs from $\pi/2$ radians is reduced by the addition of one or more further pulses subsequent to the first and second pulses such that a further signal reduction is obtained for each further pulse, the pulse angles of the further pulses being twice as large as the first pulse angle and the phases of all pulses except the first being alternated through all four 90° phase shifts during a series of transients such that an equal number of transients are acquired for each of the four 90° phase shifts of each pulse during which all other pulse phases are held constant, and wherein the receiver phase is inverted whenever the total number of pulses, whose phases have been shifted by +90° or -90° relative to the phases of the pulses prior to the first transient, is an odd number.

3. A method as claimed in claim 1 wherein nuclear magnetic resonance signals from regions of the sample where a single pulse angle differs from $\pi/2$ radians is further reduced by the application of an additional pulse prior to the first and second pulses, the pulse angle of the additional pulse being twice as large as the first pulse and the phase of the first pulse being alternated between 0° and 180° in addition to the phase alternation of the second pulse such that an equal number of transients are acquired for each of the 0° and 180° pulse phases of the first pulse during which all other pulse phases are held constant and such that an equal number of transients are acquired for each of the four 90° phase shifts of the second pulse during which all other pulse phases are held constant, and wherein the receiver phase is inverted whenever the phase of the first pulse is shifted by 180° or whenever the phase of the second pulse is shifted by +90° or −90° relative to the phases of the pulses prior to the first transient but not inverted whenever both first and second pulse phases have been shifted in this way.

4. A method as claimed in claim 1 wherein nuclear magnetic resonance signals from regions of the sample where a single pulse angle differs from $\pi/2$ radians is further reduced by the application of an additional pulse prior to the first and second pulses and by the application of one or more further pulses subsequent to the first and second pulses such that a signal reduction is obtained for each additional and further pulse provided the pulse angles of the additional and further pulses are twice as large as the pulse angle of the first pulse and the phase of the first pulse is alternated between 0° and 180° and the phases of the second and further pulses are alternated through all four 90° phase shifts such that an equal number of transients are acquired for all phase combinations of the first, second and further pulses, and wherein the receiver phase is inverted for all phase combinations for which an odd number is obtained for the sum of the number of the second and further pulses having phases +90° or −90° relative to the phases for the first transient plus the number one if the first pulse has a phase of 180° relative to its phase for the first transient.

5. A method as claimed in claim 1 wherein nuclear magnetic resonance signals from regions of the sample where a single pulse angle differs from $\pi/2$ radians is further reduced by the application of an additional pulse prior to the first and second pulses, the pulse angle of the additional pulse being twice as large as the first pulse and the phase of the additional pulse being alternated between 0° and 180° in addition to the phase alternation of the second pulse such that an equal number of transients are acquired for each of the 0° and 180° pulse phases of the additional pulse during which all other pulse phases are held constant and such that an equal number of transients are acquired for each of the four 90° phase shifts of the second pulse during which all other pulse phases are held constant, and wherein the receiver phase is inverted when the phase of the second pulse is shifted by +90° or −90° relative to the phase of the second pulse used for the first transient.

6. A method as claimed in claim 1 wherein nuclear magnetic resonance signals from regions of the sample where a single pulse angle differs from $\pi/2$ radians is further reduced by the application of an additional pulse prior to the first and second pulses and by the application of one or more further pulses subsequent to the first and second pulses such that a signal reduction is obtained for each additional and further pulse provided the pulse angles of the additional and further pulses are twice as large as the pulse angle of the first pulse and the phase of the additional pulse is alternated between 0° and 180° and the phases of the second and further pulses are alternated through all four 90° phase shifts such that an equal number of transients are acquired for all phase combinations of the additional, second and further pulses, and wherein the receiver phase is inverted for all phase combinations for which an odd number is obtained for the sum of the number of the second and further pulses having phases +90° or −90° relative to the phases for the first transient.

7. A method as claimed in any one of claims 1 to 6 wherein the relative pulse angles are varied.

8. A method as claimed in any one of claims 1 to 6 wherein a quadrature phase compensation scheme is employed in addition to the existing phase alternation schemes.

9. A method as claimed in any one of claims 1 to 6 wherein in substitution for any pulse-phase combination which is accompanied by inversion of receiver phase, a pulse-phase combination having all pulse-phases inverted relative to the original pulse-phase combination is used, and wherein the same receiver phase is used for all transients.

10. A method as claimed in claim 1 or 2 wherein delay periods of any magnitude may be used between the pulses wherein the total delay period between the first pulse and the beginning of acquisition is divisible into a number of delay periods which equals the number of pulses after the first pulse such that each pulse after the first pulse is at the centre of one of these delay periods, and wherein some of these delay periods may have zero time.

11. A method as claimed in any one of claims 3 to 6 wherein delay periods of any magnitude may be used between the pulses, wherein the total delay period between the second pulse and the beginning of acquisition is divisible into a number of delay periods which equals the number of pulses after the first pulse such that each pulse after the first pulse is at the centre of one of these delay periods, wherein some of these delay periods may have zero time and wherein a delay period of any magnitude may be used between the additional and the first pulse.

12. A method as claimed in any one of claims 1 to 6 when applied to any spin-echo application provided that one or more of the pulses which are alternated through all four 90° phase shifts are placed at the centre or centres of the spin-echo period or periods.

13. A method as claimed in any one of claims 3 to 6 when applied to inversion-recovery $T_1$ measurements provided that the incremented relaxation delay period is placed between the additional and the first pulse.

14. A method as claimed in any one of claims 1 to 6 wherein in substitution for any pulse-phase combination which is accompanied by inversion of receiver phase, a pulse-phase combination having all pulse-phases inverted relative to the original pulse-phase combination is used, wherein the same receiver phase is used for all transients, and when this method is applied to any spin-echo application provided that one or more of the pulses which are alternated through all four 90° phase shifts are placed at the centre or centres of the spin-echo period or periods.

15. A method as claimed in any one of claims 3 to 6 wherein in substitution for any pulse-phase combination which is accompanied by inversion of receiver phase, a pulse-phase combination having all pulse-phases inverted relative to the original pulse-phase combination is used, wherein the same receiver phase is used for all transients, and when this method is applied to inversion-recovery $T_1$ measurements provided that the incremented relaxation delay period is placed between the additional and the first pulse.

* * * * *